(12) United States Patent
Krouk et al.

(10) Patent No.: US 7,882,415 B2
(45) Date of Patent: Feb. 1, 2011

(54) 3-STRIPES GILBERT LOW DENSITY PARITY-CHECK CODES

(75) Inventors: Evguenii Avramovich Krouk, Saint Petersburg (RU); Andrei Anatol'evich Ovchinnikov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 867 days.

(21) Appl. No.: 11/664,147

(22) PCT Filed: Dec. 29, 2004

(86) PCT No.: PCT/RU2004/000534

§ 371 (c)(1), (2), (4) Date: Mar. 29, 2007

(87) PCT Pub. No.: WO2006/073322

PCT Pub. Date: Jul. 13, 2006

(65) Prior Publication Data
US 2007/0271496 A1 Nov. 22, 2007

(51) Int. Cl.
*H03M 13/00* (2006.01)
(52) U.S. Cl. .................. 714/755; 714/786; 714/801
(58) Field of Classification Search .......... 714/755, 714/786, 801
See application file for complete search history.

(56) References Cited

U.S. PATENT DOCUMENTS 7,168,033 B1 * 1/2007 Wu et al. .................. 714/801
2003/0033570 A1 * 2/2003 Khannanov et al. .......... 714/755
2003/0037298 A1 2/2003 Eleftheriou et al.
2008/0086670 A1 4/2008 Krouk et al.
2008/0086672 A1 4/2008 Ovchinnikov et al.

FOREIGN PATENT DOCUMENTS

WO    WO-2006073322 A1    7/2006

OTHER PUBLICATIONS

Andrew, R , "Quasi-cyclic Array Codes are Equivalent to Shortened Gilbert Codes", *Proc. IEEE International Symposium on Information Theory*, (Jun. 29, 1997),361.
Eleftheriou, E., et al., "Low-Density Parity-Check Codes for Digital Subscriber Lines", *Proc., IEEE Intl. Conf. on communications*, 1(5), (Apr. 28, 2002),1752-1757.
Fan, J. L., "Array Codes as Low-Density Parity-Check Codes", *Proc., 2nd International Symposium on Turbo Codes and Related Topics*, (Sep. 4, 2000),543-546.

(Continued)

*Primary Examiner*—Guy J Lamarre
(74) *Attorney, Agent, or Firm*—Schwegman, Lundberg & Woessner, P.A.

(57) ABSTRACT

A method and apparatus are provided for a coding process of a communication signal. A 3-stripes parity-check matrix is generated from a parity-check matrix of a Gilbert low density parity-check code, where the parity-check matrix of the Gilbert low density parity-check code has a first stripe containing identity matrices and a second stripe containing cyclic permutation matrices. A third stripe is added to form a 3-stripes parity-check matrix, which may be applied to the coding process of information in a communication channel.

42 Claims, 6 Drawing Sheets

OTHER PUBLICATIONS

Fossorier, M. P. C., "Quasi-cyclic Low-density Parity-check Codes from Circulant Permuation Matrices", *IEEE Transactions on Information Theory*, 50 (8), (Aug. 1, 2004),1788-1793.

Mittelholzer, T., "Efficient Encoding and Minimum Distance Bounds of Reed-Solomon-Type Array Codes", *Proc., IEEE International Symposium on Information Theory*, ISIT 02,(Jun. 30, 2002),282.

Neumann, P. G., "A Note on Gilbert Burst-correcting Codes", *IEEE Transactions on Information Theory*, 11 (3), (Jul. 1965),377-384.

Rao, S., "The 4D-PAM8 proposal for 10GBASE-T", *P802.3 Task Force Meeting*, URL:http://www.ieee802.org/3/IOGBT/public/nov03/rao_1_1103.pdf>,(Sep. 14, 2005),1-21.

Gilbert, E N., "A problem in binary coding", *In Proceedings of the Symposium in Applied Mathematics*, vol. 10, (1960),291-97.

Krouk, E A., et al., "Low-density parity-check burst error-correcting codes", *In 2nd International Workshop Algebraic and combinatorial coding theory, Leningrad*, 1990, 3 pgs.

* cited by examiner

3-STRIPES GILBERT LOW DENSITY PARITY-CHECK CODES

RELATED APPLICATIONS

This application is a U.S. National Stage Filing under 35 U.S.C. 371 from International Patent Application Serial No. PCT/RU2004/000534, filed Dec. 29, 2004, and published on Jul. 13, 2006 as WO 2006/073322 A1, which is incorporated herein by reference.

TECHNICAL FIELD

Embodiments of the invention relate generally to error correcting of communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits, in which a number of the bits are information (message) bits and a number of bits are used for error correction. A codeword having a length of n bits includes k bits for the message length of the code and r=n−k redundant bits. The r bits are for correction and are r parity check bits. A parity check matrix, H, contains a set of parity check equations that define the codeword according to the relation:

$$HC^T = 0,$$

where C is the n-dimensional vector of the codeword bits. At a receiver if this relation is not satisfied, then the received codeword is not valid and must either be corrected or retransmitted.

A variety of schemes for decoding a codeword that has propagated through a communication channel exist. Some schemes may provide accuracy and other schemes may provide fast decoding. In high speed data communication what is needed is a decoding scheme that is accurate and fast, but at the same time can be implemented without a significant amount of complexity.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Low-density parity check (LDPC) codes provide a powerful forward error correcting tool in high-speed communication systems due to the low decoding complexity and the bit-error rate (BER) achieved in an additive white Gaussian noise (AWGN) channel. LDPC codes use a parity check matrix containing mostly zeros and a limited number of ones. A binary regular (n, $\gamma$, $\rho$) LDPC code has a codeword length, or block length, of n bits and a parity check matrix with exactly $\gamma$ ones in each column and exactly $\rho$ ones in each row. In the LDPC code, each code bit is checked by $\gamma$ parity checks and each parity check uses $\rho$ code bits. Further, the code has a rate, R, defined as R=k/n, where k is the number of message (information) bits in the codeword having n bits. Examples of known LDPC decoders include, among others, the min-sum algorithm, the a posteriori probability (APP) decoding algorithm, and the uniformly most powerful (UMP) decoder.

Low-density parity-check codes provide error-correcting codes that are adapted for very fast decoding procedures and effective error performance in what is known as the waterfall region, the region where the BER decreases rapidly with the increase of signal-to-noise ratio, SNR. However, some LDPC codes may have poor minimal distance. Distance provides a measure of the difference between codewords in a block code. A Hamming distance between two codewords is the number of corresponding positions in which the two codewords differ. A minimal distance for a code may be derived as the smallest value of the set of distances between each of the codewords in a code block.

A code that has been applied to correct bursts of errors that may be applied as a LPDC code construction, that is a code construction that may be decoded by LDPC decoders, is a Gilbert code. Gilbert codes can be realized as quasi-cyclic block codes having a parity-check matrix formed as a matrix having two stripes: a stripe containing identity matrices and a stripe containing cyclic permutation matrices. A parity-check matrix contains rows of zeros and ones, primarily zeros. A number of rows and columns may be arranged and grouped as a block of zeros and ones. A stripe is a row of blocks in the parity-check matrix. Each block may be arranged as a matrix.

An example of a parity-check matrix for a Gilbert LDPC code may be given by equations (1) and (2) as $$H_l = \begin{bmatrix} I_m & I_m & I_m & \ldots & I_m \\ I_m & C & C^2 & \ldots & C^{l-1} \end{bmatrix}, \quad (1)$$

where $$C = \begin{bmatrix} 0 & 0 & 0 & \ldots & 0 & 1 \\ 1 & 0 & 0 & \ldots & 0 & 0 \\ 0 & 1 & 0 & \ldots & 0 & 0 \\ \ldots & \ldots & \ldots & \ldots & \ldots & \ldots \\ 0 & 0 & 0 & \ldots & 1 & 0 \end{bmatrix}. \quad (2)$$

The term, $I_m$, is a m×m-unity matrix and C is a cyclic permutation matrix. As a cyclic permutation matrix, C has the property that multiplying a vector by C is identical to cyclic shift on one position. The term, $C^i$, represents i multiplications by C (raising C by the power i), which is identical to cyclic shift on i positions. Thus, the parity check matrix, $H_l$, may be considered to be a matrix having two stripes, or layers. The first stripe has l identity matrices concatenated as shown above. The second stripe has an identity matrix and l–1 cyclic permutation matrices, $C^i$, where i ranges from 1 to l–1. Selecting different values for l and m allows for different Gilbert code constructions having different parameters. Further, in addition to defining the size of the identity matrix used in an application, m is related to the number of message bits, k, in an associated codeword having a code length of n, where k=n–2m+1. The value of l is the number of blocks in a row of the parity-check matrix and is related to the code length n, which relates l to the number of message bits, k. The value of l is less than m.

As noted, Gilbert codes may provide a means to correct bursts of errors. However, the performance of a Gilbert LDPC code construction in correcting independent individual errors is degraded by having a very low minimal Hamming distance, which is 4 for this class of codes. Examples of correcting independent errors include correcting independent errors in channels without memory, such as an AWGN channel and in communication systems with interleaving procedures.

In an embodiment, an LDPC code construction is generated by adding a third stripe to the parity-check matrix of a Gilbert code. The LDPC code is herein referred to as a 3-stripes Gilbert LDPC code. The third stripe may be formed as a concatenation of cyclic permutation matrices raised to some power. Embodiments of a 3-stripes Gilbert LDPC code may provide LPDC code schemes having enhanced parameters with respect to an associated Gilbert code, such as increased minimal distance.

Figure 1:
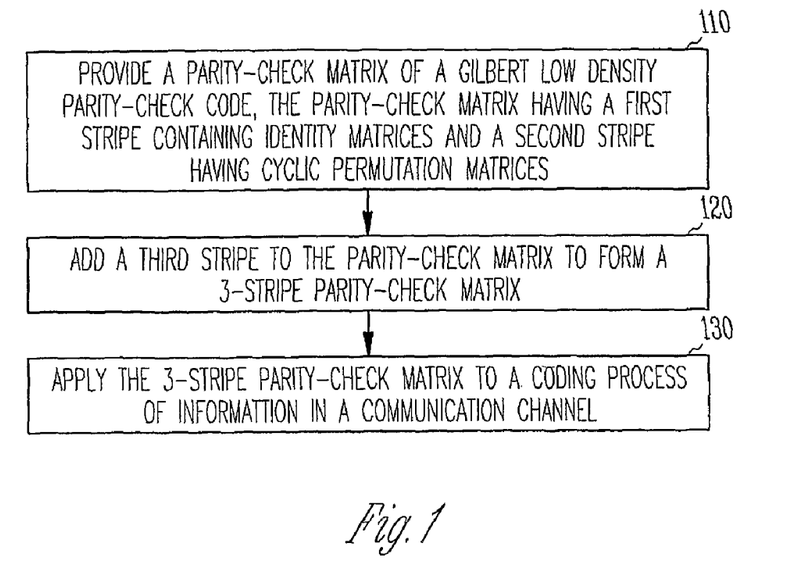
FIG. 1 shows a flow diagram of an embodiment of a coding method that modifies a Gilbert code construction.

FIG. 1 shows a flow diagram of an embodiment of a coding method that modifies a Gilbert code construction. Such a modification may provide error correction to independent errors. At 110, a parity-check matrix of a Gilbert low density parity-check code is provided, where the parity-check matrix has a first stripe containing identity matrices and a second stripe has cyclic permutation matrices. At 120, a third stripe is added to the parity-check matrix to form a 3-stripes parity-check matrix. An embodiment for a parity-check matrix for a 3-stripes Gilbert code construction may be realized in equation 3 as $$H_l^3 = \begin{bmatrix} I_m & I_m & \ldots & I_m \\ I_m & C & \ldots & C^{l-1} \\ C^{i_0} & C^{i_1} & \ldots & C^{i_{l-1}} \end{bmatrix}. \quad (3)$$

The powers, $i_j$, of the cyclic permutation matrices are generally non-negative integers. The power $i_j$ may be in the range from 0 to m–1. For an embodiment with $i_j$ larger than m–1, C raised to the power $i_j$ equals $C^k$ for some k between 0 and m–1, such that k=$i_j$ modulo m. The third stripe may be formed to generate a 3-stripes parity-check matrix having no cycles of length 4. The third stripe may be added to provide a code with a minimal distance that is greater than 4. In an embodiment, the third stripe is generated having a component formed as a cyclic permutation matrix raised to a power, where the cyclic permutation matrix is taken from the second stripe of the two stripe Gilbert parity-check matrix. In an embodiment, each power, $i_j$, for a cyclic permutation matrix at a jth component position in the third stripe is selected such that $i_j \neq j$. At 130, the 3-stripes parity-check matrix is applied to a coding process of information in a communication channel. The coding process may be a decoding of a received signal in a decoder. The coding may be an encoding of message bits into codewords associated with the 3-stripes Gilbert parity-check matrix.

In an illustrative example of an embodiment, codewords of weight 4 in a Gilbert code are considered. The weight of a codeword is the number of non-zero elements that the codeword contains. In a Gilbert code, a weight of 4 is the minimum non-zero weight for a codeword. Though the following illustrative example of an embodiment relates to codewords of weight 4, other embodiments may be applied with codes of other weights.

Figure 2:
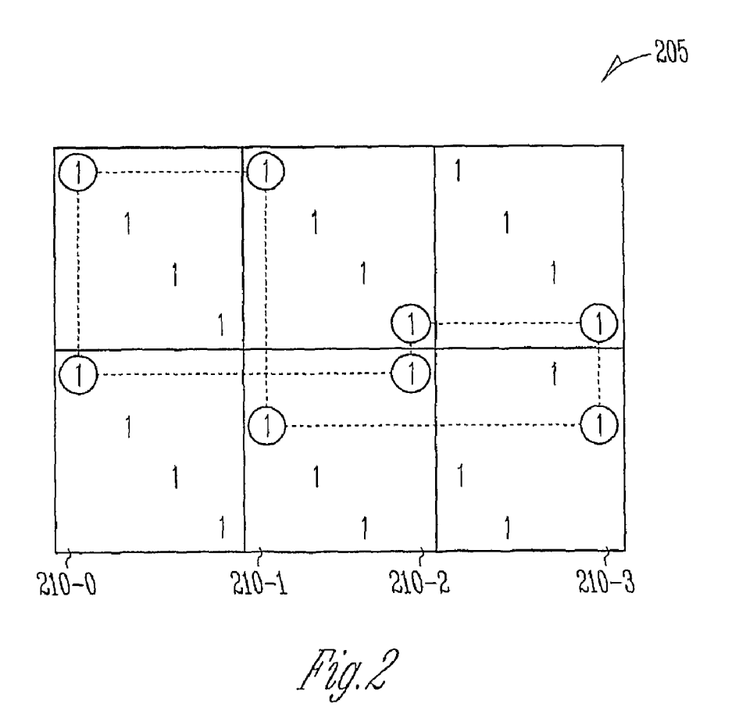
FIG. 2 shows a cycle in a parity-check matrix for codewords of weight 4 in a Gilbert code.

FIG. 2 shows a cycle in a parity-check matrix 205 for codewords of weight 4 in a Gilbert code. The non-zero entries in parity-check matrix 205 shown in circled lines may be considered as nodes of a graph, and the dotted lines, drawn horizontally and/or vertically between such nodes, may be considered as the edges of this graph. Then the presence of a codeword means the presence of a closed cycle in such a graph, as shown for example on FIG. 2. The modulo-2 sum of the columns 210-0 210-1, 210-1, 210-3 containing the vertical dotted lines is equal to a zero column, which determines a codeword. FIG. 2 shows a cycle of length 4, where the cycle length corresponds to the codeword weight. A cycle of length 4 corresponds to codeword of weight 4. This cycle contains 8 dotted lines (as in FIG. 2), 4 vertical and 4 horizontal, where the 4 vertical dotted lines determine the weight of the codeword. When adding the third stripe to a two stripe parity-check matrix of a Gilbert code, a codeword of minimal weight corresponds to cycles both in the first-second pair of stripes and in the first-third pair of stripes. A codeword of minimal weight is the non-zero codeword with the least number of non-zero elements among all codewords. Therefore, if some columns form the cycle in first and second stripes, and do not form a cycle in first and third stripes, this set of columns do not represent the codeword.

Figure 3:
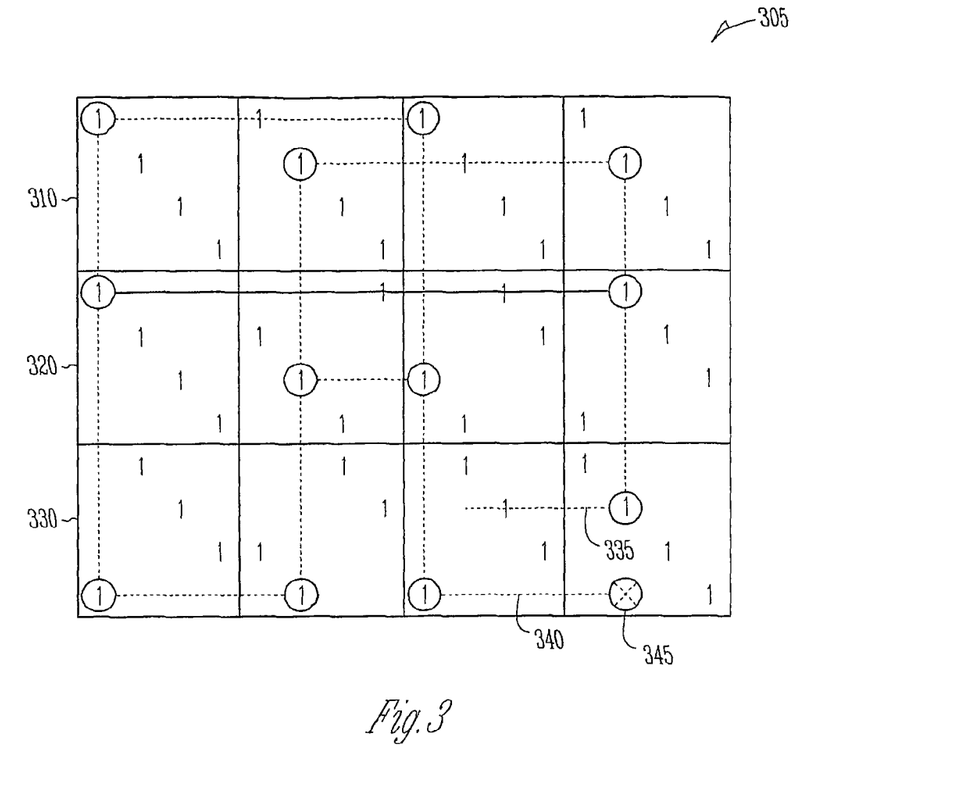
FIG. 3 shows an illustrative example of embodiment of a third stripe added to a two stripe parity-check matrix to break the cycles in the Gilbert parity-check matrix of FIG. 2.

FIG. 3 shows an illustrative example of embodiment of a third stripe added to a two stripe parity-check matrix to break the cycles in the Gilbert parity-check matrix in FIG. 2. In an embodiment, the blocks in the third stripe can be constructed as permutation of degrees from the second stripe. A codeword in such 3-stripes parity-check matrix is determined by two cycles in a graph: one cycle is in first stripe 310 and second stripe 320 and another cycle in first stripe 310 and third stripe 330. The circles in FIG. 3 correspond to nodes and the dotted lines correspond to edges of a graph. The vertical edges of these cycles should belong to the same columns in the parity-check matrix. In FIG. 3, the cycle exists in first and second stripes 310, 320, but not in first and third stripes 310, 330 with respect to the same columns of the 3-stripes parity-check matrix 305. A cycle is shown in first and second stripes 310, 320 in some set of columns, but the same columns in first and third stripes 310, 330 do not form the cycle as shown by the line 335 indicating ones are not in the corresponding columns in the previous block and line 340 indicating that a one is missing from a corresponding position 345 in a block to complete the cycle. Therefore, these columns do not determine the codeword in the 3-stripes code, though as shown with respect to FIG. 2 they would determine the codeword in a 2-stripes Gilbert code.

With respect to the 3-stripes parity-check matrix of equation (3), removal of all cycles of length 4 in the parity-check matrix can be achieved by appropriately selecting degrees $i_0, \ldots, i_{l-1}$ in the third stripe. As shown in FIG. 3 the broken cycle in the third stripe is shown by lines 335, 340, and circle 345. Since there is a cycle in the first and second stripes and there is no cycle in first and third stripe (on the same columns), the codeword of weight 4 is removed from these columns in the case of the 3-stripes parity-check matrix. The same situation occurs for every codeword of weight 4 in first two stripes. Removing all cycles of length 4 provides a minimal distance increased from the minimal distance of the associated 2-stripes code. In an embodiment, it is sufficient that in the 3-stripes parity-check matrix in equation 3 that $i_i \neq j$ to remove all cycles of length 4 in the parity-check matrix.

In an embodiment, adding a third stripe provides a modified Gilbert code. If by adding the third stripe, all codewords of weight 4 are removed (i.e., there will be no cycles in first and third stripes on the columns where there are cycles in first and second stripes), then the minimum weight of a non-zero codeword is increased. Such an increased minimal weight may be at least 6. As a result, the minimal distance of the code is also increased, since the code minimal distance is equal to the minimal weight of the non-zero codeword. By adding a third stripe, a family of codes with wider range for a code rate, R, than using only two stripes may be obtained. Further, adding a third stripe makes modified Gilbert codes practical for usage in memoryless channel, where without the third stripe, the lower minimal distance of a Gilbert code leads to higher decoding error probability. Typically, a minimal distance of 4 of a code is considered very small with respect to correcting independent errors. Thus, Gilbert codes (2-stripe parity-check matrices) may not be appropriate for correcting independent errors.

Figure 4:
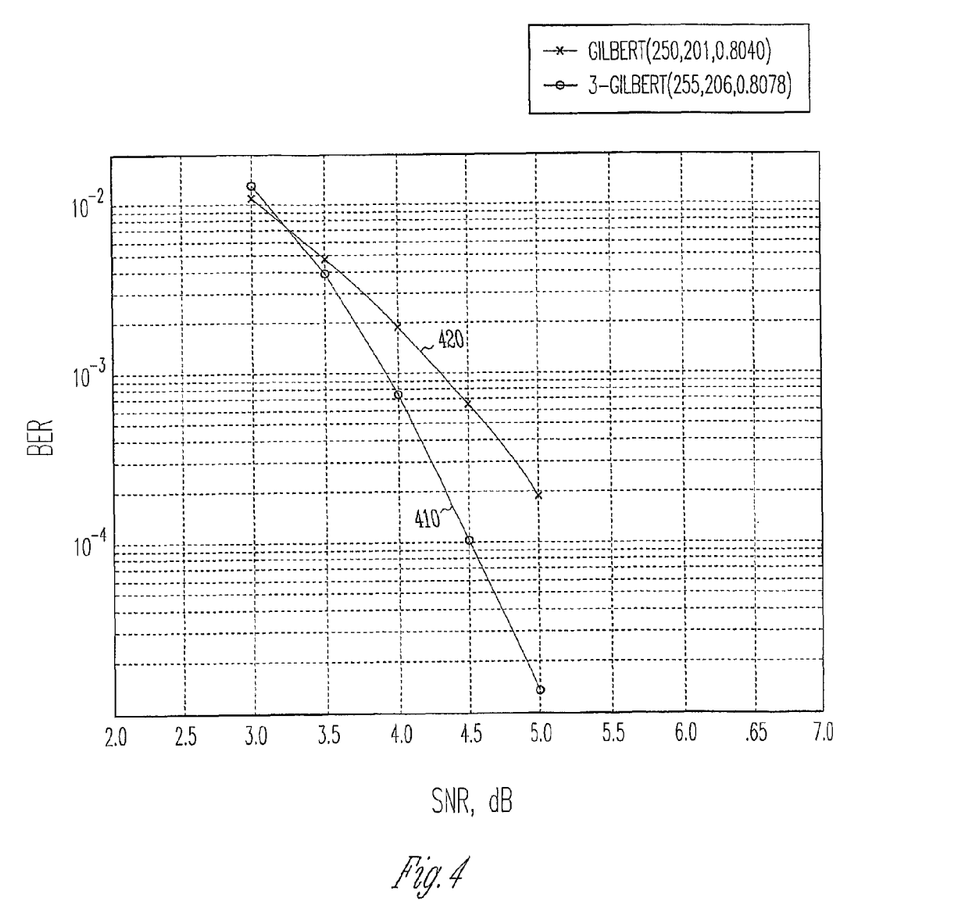
FIG. 4 shows simulation results of an embodiment of a 3-stripe Gilbert code with respect to a standard Gilbert code for the case of an AWGN channel.

FIG. 4 shows simulation results an embodiment of a 3-stripe Gilbert code with respect to a standard Gilbert code for the case of AWGN channel. The 3-stripe Gilbert code represented by curve 410 has a message length of 206 and a codeword length of 255 with a rate of 0.8078. A corresponding Gilbert code represented by curve 420 has a message length of 201 and a codeword length of 250 with a rate of 0.8040. Comparing the two codes of comparable rate of approximately 0.8, the 3-stripe Gilbert code shows enhanced performance with respect its BER-SNR relationship relative to the standard Gilbert code.

Figure 5:
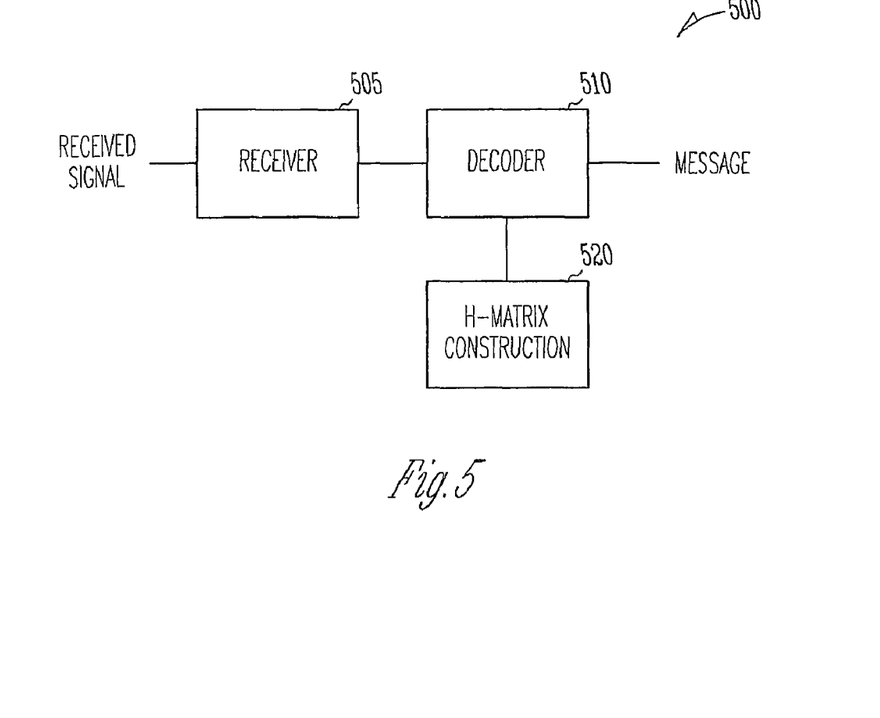
FIG. 5 shows a block diagram of an embodiment of an apparatus including a decoder that is adapted to decode 3-stripes Gilbert LDPC codes received from a communication channel.

FIG. 5 shows a block diagram of an embodiment of an apparatus 500 including a decoder 510 that is adapted to decode 3-stripes Gilbert LDPC codes received from a communication channel. Decoder 510 may be realized in the form of a low density parity-check decoder that applies H-matrix construction 520 to decode a received signal from receiver 505 to provide a message from a valid codeword. In an embodiment, H-matrix construction 520 may be a 3-stripe parity-check matrix for a 3-stripe Gilbert LDPC code. Use of 3-stripes Gilbert LDPC codes allows for independent error correction, though capabilities in apparatus 500 may have the capability to provide burst error correction. H-matrix construction 520 may be realized as a set of parameters defining the 3-stripe parity-check Gilbert matrix stored as an integral part of decoder 510 or external to decoder 510. Additional details of apparatus 500 are not shown to focus on the application of embodiments of 3-stripes Gilbert LDPC codes. Embodiments of apparatus 500 may include, but is not limited to, high-speed modems, 10 Gigabit Ethernet devices, wireless Ethernet devices and/or other communication systems that provide for error correction in data transmission.

Figure 6:
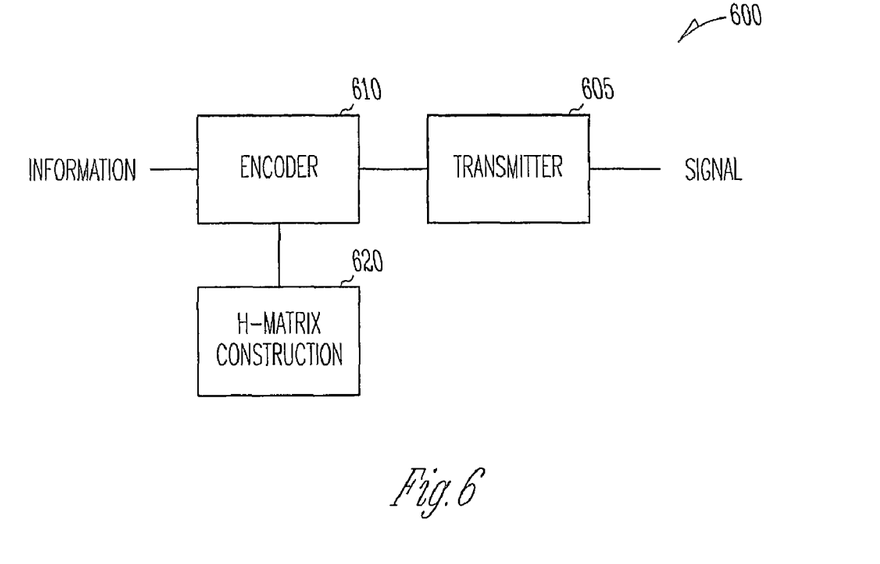
FIG. 6 shows a block diagram of an embodiment of an apparatus including an encoder that is adapted to encode messages with respect to a 3-stripes Gilbert LDPC code to form codewords for transmission in a communication channel.

FIG. 6 shows a block diagram of an embodiment of an apparatus 600 including an encoder 610 that is adapted to encode messages with respect to a 3-stripes Gilbert LDPC code to form codewords for transmission in a communication channel. Encoder 610 may be realized in the form of a low density parity-check encoder that generates codewords from received information with respect to H-matrix construction 520 to transmit a signal from transmitter 605 into a communication channel. In an embodiment, H-matrix construction 620 may be a 3-stripe parity-check matrix for a 3-stripe Gilbert LDPC code. H-matrix construction 620 may be realized as a set of parameters defining the 3-stripe parity-check Gilbert matrix stored as an integral part of encoder 610 or external to encoder 610. Additional details of apparatus 600 are not shown to focus on the application of embodiments of 3-stripes Gilbert LDPC codes. Embodiments of apparatus 600 may include, but is not limited to, high-speed modems, 10 Gigabit Ethernet devices, wireless Ethernet devices and/or other communication systems that provide for error correction in data transmission.

Various embodiments or combination of embodiments for apparatus and methods for generating and applying 3-stripes Gilbert LDPC codes can be realized in hardware implementations, software implementations, and combinations of hardware and software implementations. These implementations may include a computer-readable medium having computer-executable instructions for performing an embodiment that generates and/or applies 3-stripes Gilbert LDPC codes. In an embodiment, a computer-readable medium stores instructions which, when performed by a machine, cause the machine to provide a parity-check matrix of a Gilbert low density parity-check code (the parity-check matrix has a first stripe containing identity matrices and a second stripe containing cyclic permutation matrices), to add a third stripe to the parity-check matrix to form a 3-stripes parity-check matrix, and to apply the 3-stripes parity-check matrix to a coding process of information in a communication channel. In an embodiment, the 3-stripes parity-check matrix is a 3-stripes Gilbert parity-check matrix having no cycles of length 4. The 3-stripes Gilbert parity-check matrix may have a plurality of components, where each component is formed as a cyclic permutation matrix raised to a power. The cyclic permutation matrix may be taken from the second stripe of the parity-check matrix. In an embodiment, each power, $i_j$, for a jth cyclic permutation matrix at a jth position in the third stripe has a value such that $i_j \neq j$. The computer-readable medium is not limited to any one type of medium. The computer-readable medium used will depend on the application using an embodiment of a 3-stripes Gilbert LDPC code.

Figure 7:
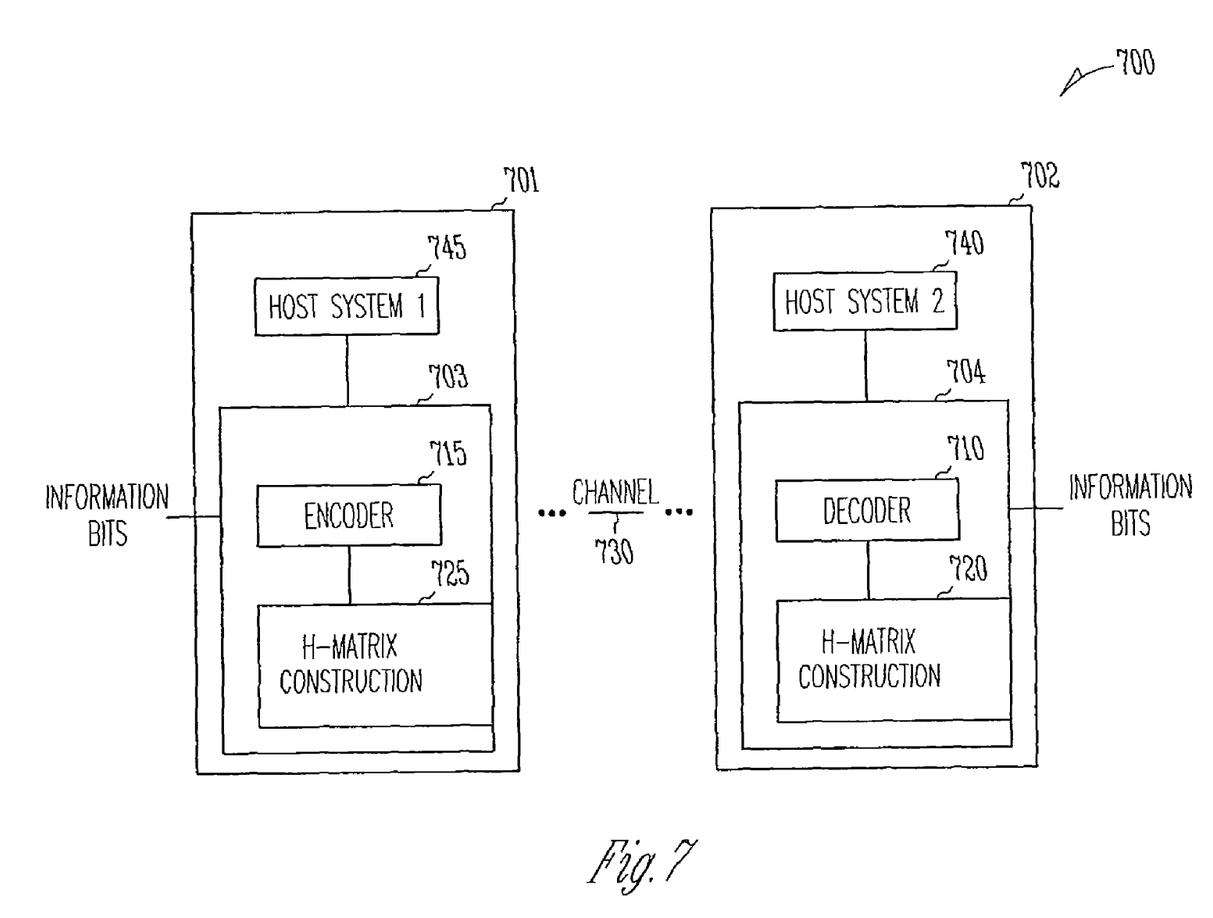
FIG. 7 illustrates a block diagram of an embodiment of a communication network having systems implementing an embodiment of a 3-stripes Gilbert LDPC code.

FIG. 7 illustrates a block diagram of an embodiment of a communication network 700 having systems implementing an embodiment of a 3-stripes Gilbert LDPC code. Communication network 700 may include network node 701 having an apparatus 703 with an encoder 715 using H-matrix construction 725 implementing an embodiment of a 3-stripe Gilbert parity-check matrix. Network node 701 may be separated by a channel 730 from network node 702 in communication network 700. Network node 702 may have an apparatus 704 with a decoder 710 using H-matrix construction 720 implementing an embodiment of a 3-stripe Gilbert parity-check matrix. For messages transmitted between network nodes 701 and 702, H-matrix construction 725 and H-matrix construction 720 may include a set of the same parameters for decoding signals in apparatus 704 that provides information bits that are encoded in apparatus 703. In an embodiment, apparatus 703 and 704 may each include a decoder and an encoder. Apparatus 703 and apparatus 704 may be realized as one or more embodiments of an apparatus using one or more embodiments of methods employing a 3-stripe parity-check matrix for encoding and decoding such as the embodiments of FIGS. 5 and 6.

In apparatus 703, encoder 715 and H-matrix construction 725 may be realized as a single unit or, alternatively H-matrix construction 725 may be configured external to encoder 715. Apparatus 703 may include a transmitter or a transceiver. Apparatus 710 may generate signals carrying data into channel 730. The data may provide information that originates from host system 745 communicatively coupled to apparatus 703 or from other systems at network node 701. A host system may provide one or more functions at a node. A host system may direct operations of other systems and/or apparatus at the node. Host system 745 may include an external connection that is wired or wireless, as part of the coupling to apparatus 703. Alternatively, host system 745 may include apparatus 705. Host system 745 may be realized as a switch, a router, a computer, a server, or combination of these elements. Host system 745 may couple to apparatus 703 over a medium that is compatible with Peripheral Component Interconnect (PCI) or with PCI express.

In apparatus 704, decoder 710 and H-matrix construction 720 may be realized as a single unit or, alternatively H-matrix construction 720 may be configured external to decoder 710. Apparatus 704 may include a receiver or a transceiver. Apparatus 704 may receive signals carrying data from channel 730. The data may be decoded into appropriate codewords to provide information to host system 740 communicatively coupled to apparatus 704 or to other systems at network node 702. Host system 740 may include an external connection that is wired or wireless, as part of the coupling to apparatus 704. Alternatively, host system 740 may include apparatus 704. Host system 740 may be realized as a switch, a router, a computer, a server, or combination of these elements. Host system 740 may couple to apparatus 704 over a medium that is compatible with Peripheral Component Interconnect (PCI) or with PCI express.

The network nodes 701, 702 each may represent processing systems having a physical layer (PHY) entity arranged to operate in accordance with 10 GBase-T as defined by the IEEE 802.3an series of standards, for example. The 10 GBase-T PHY may interface with, for example, a 10 G media access control (MAC) and Gigabit Media Independent Interface (XGMII) in the IEEE architecture. The 10 GBase-T PHY may include part of a network interface card (NIC), for example. Nodes 701, 702 may include any processing system and/or communications device suitable for use with a 10 GBase-T device. For example, nodes 701, 702 may be implemented as a pair of switches, a pair of routers, a pair of servers, a switch and a router, a switch and a server, a server and a router, and so forth. In addition, nodes 701, 702 also may be part of a modular system in which 10 GBase-T is the high-speed connection for the system. In an embodiment, network nodes 701, 702 may be arranged such that host system 735 and host system 740 are configured as a single host system. Further examples for nodes 701, 702 may include high-end servers, supercomputers, clusters, grid computing, workgroup switch uplinks, aggregation uplinks, storage systems, and so forth. The embodiments are not limited in this context. Alternatively, the nodes 701, 702 each may represent processing systems having a physical layer (PHY) entity arranged to operate in accordance with the IEEE 802.11 series of standards. As can be appreciated by those skilled in the art, there may be other elements in network nodes 701, 702 and apparatus 703, 704 to communicate in a network that are not shown or discussed herein to focus on application of 3-stripes Gilbert LDPC codes in a communication network.

Figure 8:
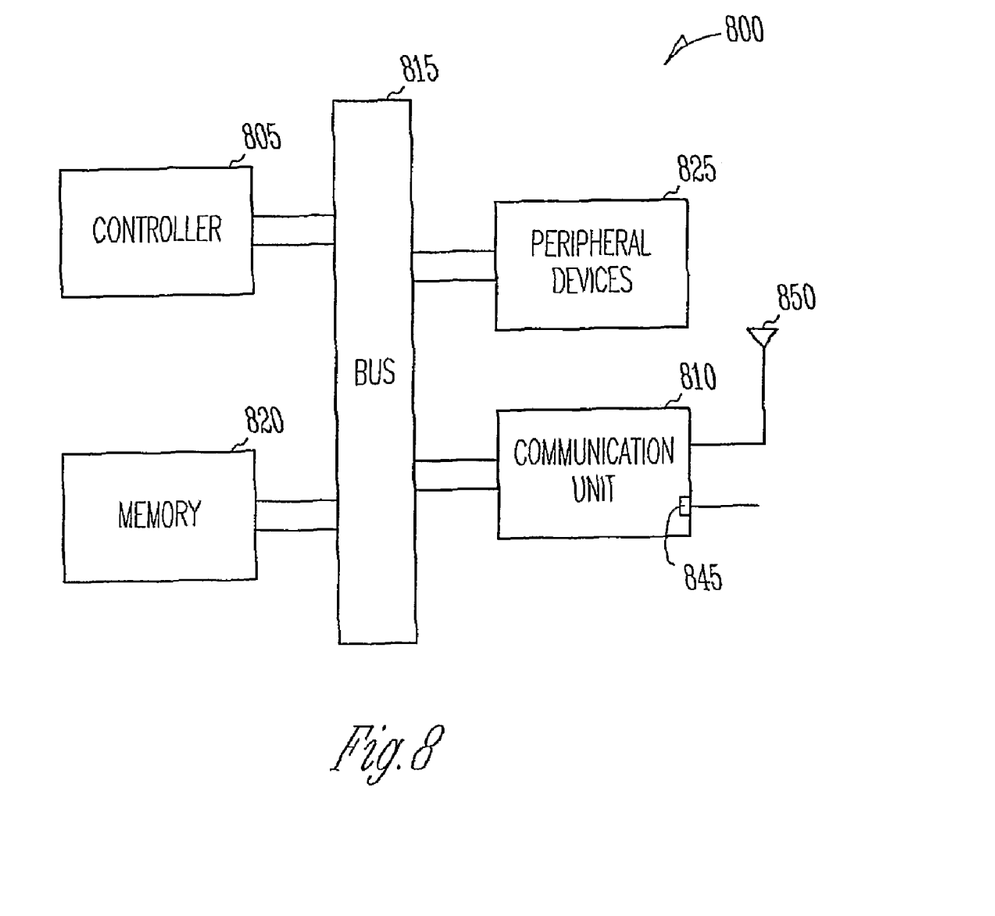
FIG. 8 illustrates a block diagram of an embodiment of a system 800 employing an embodiment of a 3-stripes Gilbert LDPC code to communicate in a network

FIG. 8 illustrates a block diagram of an embodiment of a system 800 employing an embodiment of a 3-stripes Gilbert LDPC code to communicate in a network. System 800 includes a controller 805, a memory 820, and a bus 815, where bus 815 provides electrical connectivity between controller 805 and memory 820 and between controller 805 and a communication unit 810. Communication unit 810 may be a network interface to couple to a wired network or a network interface to couple to a wireless network. Alternatively, communication unit 810 may be a network interface to couple to a wired network and to a wireless network. A wired network may include a network having wire channels, fiber optic channels, and/or co-axial channels.

In an embodiment, communication unit 810 may include a network interface card. In an embodiment, communication unit 810 may include a communications device compliant with 10 GBase-T device. In an embodiment, communication unit 810 may include a connection 845 to a wired network. In a wireless embodiment, communication unit 810 may be coupled to an antenna 850. In an embodiment, antenna 850 may be a substantially omnidirectional antenna. System 800 may include, but is not limited to, information handling devices, wireless systems, telecommunication systems, fiber optic systems, electro-optic systems, and computers.

In an embodiment, controller 810 is a processor. In an embodiment, communication unit 810 includes a transceiver that allows system 800 to communicate with other systems. Communication unit 810 may include encoding and decoding units in various appropriately modified combinations of the embodiments of apparatus 500 and 600 of FIGS. 5 and 6, respectively. Alternatively, decoding and encoding units may be included in peripheral devices 825 external to communication unit 810 configured as a communication interface.

Memory 820 may include any form of computer-readable medium that has computer executable instructions to encode and decode data using 3-stripes Gilbert parity-check matrix in accordance with various embodiments for decoding and encoding 3-stripes Gilbert LDPC codes. An embodiment may include an additional peripheral device or devices 825 coupled to bus 815. Bus 815 may be compatible with PCI or with PCI express. Peripheral devices 825 may also include displays, additional storage memory, or other control devices that may operate in conjunction with controller 805. Alternatively, peripheral devices 825 may include displays, additional storage memory, or other control devices that may operate in conjunction with controller 805, communication unit 810, and/or memory 820.

Embodiments for a system that includes an encoding unit and a decoding unit having a 3-stripes Gilbert LDPC code construction may be used in any system operating with a communication channel. The communication channel may be part of a land based communication network or a wireless communication network. Indeed, embodiments may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan area network (WMAN), a wireless wide area network (WWAN), a cellular network, a third generation (3G) network, a fourth generation (4G) network, a universal mobile telephone system (UMTS), and similar communication systems.

Various embodiments of 3-stripes Gilbert LDPC codes provide for an increased minimal distance with respect to the minimal distance of an associated standard two stripe Gilbert code. Such embodiments provide enhanced flexibility with respect to coding parameters and fast decoding procedures, since the number of non-zero elements in the 3-stripes parity-check matrix remains low. Employing 3-stripes Gilbert LDPC codes may provide enhanced effective performance in a communication channel.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   providing a parity-check matrix of a Gilbert low density parity-check code, the parity-check matrix having a first stripe containing identity matrices and a second stripe containing an initial identity matrix concatenated with cyclic permutation matrices forming a 2-stripe Gilbert code;
   adding a third stripe to the parity-check matrix to form a 3-stripes parity-check matrix having the two stripes of the 2-stripe Gilbert code and a minimal distance increased from that of the 2-stripe Gilbert code, the third stripe formed by a second concatenation of cyclic permutation matrices each raised to a respective non-negative integer power, wherein the concatenation of the third stripe includes an initial matrix different from an identity matrix; and
   applying the 3-stripes parity-check matrix to a coding process of information in a communication channel.

2. The method of claim 1, wherein adding a third stripe to the parity-check matrix to form a 3-stripes parity-check matrix includes adding the third stripe to the parity-check matrix to form the 3-stripes parity-check matrix having no cycles of length 4.

3. The method of claim 1, wherein adding a third stripe to the parity-check matrix to form a 3-stripes parity-check matrix includes adding the third stripe to the parity-check matrix to form the 3-stripes parity-check matrix to provide a minimal distance of at least 6 to a code.

4. The method of claim 1, wherein adding a third stripe to the parity-check matrix includes adding the third stripe having the cyclic permutation matrix of the concatenation taken from the second stripe of the parity-check matrix.

5. The method of claim 4, wherein adding the third stripe includes selecting one or more powers for cyclic permutation matrix components such that the selection forms the 3-stripes parity-check matrix having no cycles of length 4.

6. The method of claim 5, wherein selecting one or more powers includes selecting each power, for a cyclic permutation matrix at a jth component position in the third stripe such that $i_j \neq j$, j ranging from zero to a non-negative non-zero integer.

7. The method of claim 1, wherein applying the 3-stripes parity-check matrix to a coding process includes decoding a received signal based on the 3-stripes parity-check matrix to provide a valid codeword containing the information.

8. The method of claim 1, wherein applying the 3-stripes parity-check matrix to a coding process includes encoding the information based on the 3-stripes parity-check matrix.

9. A method comprising:
   receiving a signal from a communication channel;
   decoding the signal to provide a valid codeword by applying a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix; and
   extracting a message from the codeword.

10. The method of claim 9, wherein applying a 3-stripes Gilbert parity-check matrix includes applying a 3-stripes Gilbert parity-check matrix having no cycles of length 4.

11. The method of claim 9, wherein applying a 3-stripes Gilbert parity-check matrix includes applying a 3-stripes Gilbert parity-check matrix with the third stripe having the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

12. A method comprising:
   receiving information;
   encoding the information to form a codeword corresponding to a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix; and transmitting the codeword into a communication channel.

13. The method of claim 12, wherein applying a 3-stripes Gilbert parity-check matrix includes applying a 3-stripes Gilbert parity-check matrix to provide a minimal distance of at least 6 to a code.

14. The method of claim 12, wherein applying a 3-stripes Gilbert parity-check matrix includes applying a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

15. A computer readable medium that stores instructions, which when performed by a machine, cause the machine to:

decode a signal received from a communication channel to provide a valid codeword by applying a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix; and extract a message from the codeword.

16. The computer readable medium of claim 15, wherein the 3-stripes Gilbert parity-check matrix includes a 3-stripes Gilbert parity-check matrix having no cycles of length 4.

17. The computer readable medium of claim 15, wherein the 3-stripes Gilbert parity-check matrix includes a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

18. The computer readable medium of claim 15, wherein the computer readable medium that stores instructions, which when performed by a machine, cause the machine to:

provide the parity-check matrix having the first stripe containing identity matrices and the second stripe containing cyclic permutation matrices; and add the third stripe to the parity-check matrix to form the 3-stripes parity-check matrix.

19. A computer readable medium that stores instructions, which when performed by a machine, cause the machine to:

encode a message to form a codeword corresponding to a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix; and transmit a signal containing the codeword into a communication channel.

20. The computer readable medium of claim 19, wherein the 3-stripes Gilbert parity-check matrix includes a 3-stripes Gilbert parity-check matrix having no cycles of length 4.

21. The computer readable medium of claim 19, wherein the 3-stripes Gilbert parity-check matrix includes a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, i ranging from zero to a non-negative non-zero integer.

22. An apparatus comprising:

a receiver to receive a signal from a communication channel; and a low density parity-check decoder having a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix, the low density parity-check decoder coupled to the receiver to provide a valid codeword from the signal.

23. The apparatus of claim 22, wherein the 3-stripes Gilbert parity-check matrix includes a 3-stripes Gilbert parity-check matrix having no cycles of length 4.

24. The apparatus of claim 22, wherein the 3-stripes Gilbert parity-check matrix includes a 3-stripes Gilbert parity-check matrix with the third stripe having a the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

25. The apparatus of claim 22, wherein apparatus includes:

a low density parity-check encoder to provide an encoded message with respect to the 3-stripes Gilbert parity-check matrix; and a transmitter to transmit an outgoing signal containing the encoded message.

26. An apparatus comprising:

a low density parity-check encoder to encode a message to generate a codeword with respect to a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix; and a transmitter to transmit a signal containing the codeword.

27. The apparatus of claim 26, wherein low density parity-check encoder provides a set of codewords having a minimum distance greater than 4.

28. The apparatus of claim 26, wherein the 3-stripes Gilbert parity-check matrix includes a 3-stripes Gilbert parity-check matrix having no cycles of length 4.

29. The apparatus of claim 26, wherein the 3-stripes Gilbert parity-check matrix includes a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

30. A system comprising:
   an apparatus having connections to couple to a wired communication network, the apparatus including:
      a receiver to receive a signal coupled from the wired communication network; and
      a low density parity-check decoder having a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix, the low density parity-check decoder coupled to the receiver to provide a valid codeword from the signal; and
      a host system communicatively coupled to the apparatus.

31. The system of claim 30, wherein the 3-stripes Gilbert parity-check matrix includes a 3-stripes Gilbert parity-check matrix having no cycles of length 4.

32. The system of claim 30, wherein the 3-stripes Gilbert parity-check matrix includes a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

33. The system of claim 30, wherein the apparatus includes a network interface card.

34. The system of claim 30, wherein the apparatus includes a network interface compliant with 10 GBase-T.

35. The system of claim 30, wherein the host system includes at least one of a computer, a switch, a router, or a server.

36. The system of claim 30, wherein the apparatus includes a bus to couple information signals to the receiver, the bus being compatible with PCI.

37. The system of claim 30, wherein the apparatus includes a bus to couple information signals to the receiver, the bus being compatible with PCI express.

38. The system of claim 30, wherein the system includes:
   a low density parity-check encoder to encode a message to generate an outgoing codeword with respect to the 3-stripes Gilbert parity-check matrix; and
   a transmitter to transmit an outgoing signal containing the outgoing codeword.

39. A system comprising:
   a substantially omnidirectional antenna;
   a receiver coupled to the omnidirectional antenna to receive a signal; and
   a low density parity-check decoder having a 3-stripes Gilbert parity-check matrix, the 3-stripes Gilbert parity-check matrix having a third stripe in addition to having a first and a second stripe of a 2-stripe parity-check matrix of a Gilbert low density parity-check code, the first stripe being a concatenation of identity matrices and the second stripe being an initial identity matrix concatenated with cyclic permutation matrices, the 3-stripes parity-check matrix having a minimal distance increased from that of the 2-stripe Gilbert code, the third stripe constructed as a second concatenation of cyclic permutation matrices each raised to a respective non-negative integer power, wherein the concatenation of the third stripe includes an initial matrix different from an identity matrix, the low density parity-check decoder coupled to the receiver to provide a valid codeword from the signal.

40. The system of claim 39, wherein the 3-stripes Gilbert parity-check matrix includes a 3-stripes Gilbert parity-check matrix having no cycles of length 4.

41. The system of claim 39, wherein the 3-stripes Gilbert parity-check matrix includes a 3-stripes Gilbert parity-check matrix with the cyclic permutation matrix taken from the second stripe of the parity-check matrix, each power, $i_j$, for a jth cyclic permutation matrix at a jth position in the third stripe having a value such that $i_j \neq j$, j ranging from zero to a non-negative non-zero integer.

42. The system of claim 39, wherein the system includes:
   a low density parity-check encoder to encode a message to generate an outgoing codeword with respect to the 3-stripes Gilbert parity-check matrix; and
   a transmitter to transmit an outgoing signal containing the outgoing codeword.

* * * * *

UNITED STATES PATENT AND TRADEMARK OFFICE
CERTIFICATE OF CORRECTION

PATENT NO.           : 7,882,415 B2                                   Page 1 of 1
APPLICATION NO.      : 11/664147
DATED                : February 1, 2011
INVENTOR(S)          : Evguenii A. Krouk et al.

It is certified that error appears in the above-identified patent and that said Letters Patent is hereby corrected as shown below:

In column 10, line 13, in Claim 6, after "power," insert -- $i_j$, --.

In column 12, line 14, in Claim 21, delete "i" and insert -- j --, therefor.

In column 12, line 40, in Claim 24, after "with" delete "the".

In column 12, line 40, in Claim 24, before "the cyclic" delete "third stripe having a".

Signed and Sealed this
Twentieth Day of September, 2011

David J. Kappos
*Director of the United States Patent and Trademark Office*